US007608388B2

(12) United States Patent
Deutsch et al.

(10) Patent No.: US 7,608,388 B2
(45) Date of Patent: Oct. 27, 2009

(54) INKJET-IMAGEABLE LITHOGRAPHIC PRINTING MEMBERS AND METHODS OF PREPARING AND IMAGING THEM

(75) Inventors: Albert S. Deutsch, Somers, NY (US); Eugene L. Langlais, Amherst, NH (US)

(73) Assignee: Presstek, Inc., Hudson, NH (US)

( * ) Notice: Subject to any disclaimer, the term of this patent is extended or adjusted under 35 U.S.C. 154(b) by 209 days.

(21) Appl. No.: 11/249,166

(22) Filed: Oct. 12, 2005

(65) Prior Publication Data

US 2006/0166141 A1 Jul. 27, 2006

Related U.S. Application Data

(60) Provisional application No. 60/617,695, filed on Oct. 12, 2004.

(51) Int. Cl.
*G03F 7/026* (2006.01)

(52) U.S. Cl. .................. 430/302; 430/271.2; 430/327; 101/454

(58) Field of Classification Search .................. 101/465, 101/466, 453, 454, 462, 463.1, 467; 430/302, 430/270.1, 300, 271.1, 278.1, 327
See application file for complete search history.

(56) References Cited

U.S. PATENT DOCUMENTS

| 3,479,185 | A |   | 11/1969 | Chambers ...................... 96/84 |
| 3,615,567 | A |   | 10/1971 | Wilson .......................... 96/90 |
| 3,971,660 | A |   | 7/1976  | Staehle ......................... 96/33 |
| 4,070,262 | A | * | 1/1978  | Guarino et al. ............... 522/26 |
| 4,191,571 | A |   | 3/1980  | Nonogaki et al. ........... 430/335 |
| 4,275,092 | A | * | 6/1981  | Nakayama et al. .......... 427/511 |
| 4,321,178 | A | * | 3/1982  | Miller ......................... 524/159 |
| 4,719,248 | A | * | 1/1988  | Bambury et al. ............ 523/108 |
| 4,791,213 | A | * | 12/1988 | Gawne et al. ................ 549/27 |
| 4,935,463 | A |   | 6/1990  | Stockel et al. ............... 524/423 |
| 5,246,815 | A | * | 9/1993  | Ichimura et al. ......... 430/270.1 |
| 5,282,952 | A | * | 2/1994  | Sakaki ....................... 205/153 |
| 5,312,654 | A |   | 5/1994  | Arimatsu et al. ............ 427/511 |
| 5,339,737 | A |   | 8/1994  | Lewis et al. ................. 101/453 |
| 5,368,931 | A |   | 11/1994 | Kato et al. ................... 428/327 |
| 5,501,150 | A |   | 3/1996  | Leenders et al. ............ 101/466 |
| 5,530,078 | A | * | 6/1996  | Felix et al. .................... 526/91 |
| 5,533,452 | A | * | 7/1996  | Mouri et al. ............... 101/463.1 |
| 5,599,650 | A |   | 2/1997  | Bi et al. ..................... 430/273.1 |
| 5,677,106 | A |   | 10/1997 | Burberry et al. ............ 430/253 |
| 5,677,108 | A |   | 10/1997 | Chia et al. ................. 430/273.1 |
| 5,677,110 | A |   | 10/1997 | Chia et al. ................. 430/302 |
| 5,695,908 | A |   | 12/1997 | Furukawa .................. 430/205 |
| 5,705,309 | A |   | 1/1998  | West et al. ................. 430/167 |
| 5,738,013 | A |   | 4/1998  | Kellett ...................... 101/463.1 |
| 5,750,314 | A |   | 5/1998  | Fromson et al. ............. 430/302 |
| 5,849,462 | A |   | 12/1998 | Li et al. ..................... 430/283.1 |
| 5,858,604 | A |   | 1/1999  | Takeda et al. ............... 430/162 |
| 5,922,502 | A |   | 7/1999  | Damme et al. .............. 430/162 |
| 5,970,873 | A |   | 10/1999 | DeBoer et al. .............. 101/466 |
| 5,992,322 | A |   | 11/1999 | Fromson et al. ............. 101/457 |
| 6,014,929 | A |   | 1/2000  | Teng ........................... 101/456 |
| 6,014,931 | A |   | 1/2000  | Fromson et al. ............. 101/465 |
| 6,017,677 | A |   | 1/2000  | Maemoto et al. ......... 430/270.1 |
| 6,022,668 | A |   | 2/2000  | Burberry et al. ............ 430/302 |
| 6,025,022 | A |   | 2/2000  | Matzinger et al. ........... 427/256 |
| 6,033,740 | A |   | 3/2000  | Oelbrandt et al. ........... 427/511 |
| 6,044,762 | A |   | 4/2000  | DeBoer et al. .............. 101/466 |
| 6,050,193 | A |   | 4/2000  | DeBoer et al. .............. 101/466 |
| 6,084,620 | A |   | 7/2000  | Morikawa et al. ............. 347/96 |
| 6,161,928 | A |   | 12/2000 | Morikawa et al. ............. 347/96 |
| 6,171,748 | B1 |  | 1/2001  | Tanaka et al. ............... 430/138 |
| 6,182,569 | B1 |  | 2/2001  | Rorke et al. ................ 101/457 |
| 6,182,570 | B1 |  | 2/2001  | Rorke et al. ................ 101/462 |
| 6,186,067 | B1 |  | 2/2001  | Rorke et al. ................ 101/467 |
| 6,187,380 | B1 |  | 2/2001  | Hallman et al. ............. 427/261 |
| 6,245,421 | B1 |  | 6/2001  | Aurenty et al. ........... 428/304.4 |
| 6,245,486 | B1 |  | 6/2001  | Teng ........................... 430/303 |
| 6,283,030 | B1 |  | 9/2001  | Fromson et al. ............. 101/465 |
| 6,294,313 | B1 |  | 9/2001  | Kobayashi et al. .......... 430/302 |
| 6,315,916 | B1 |  | 11/2001 | Deutsch et al. ............... 216/93 |
| 6,322,950 | B1 |  | 11/2001 | Sorori et al. ............... 430/281.1 |
| 6,341,560 | B1 |  | 1/2002  | Shah et al. ................ 101/463.1 |
| 6,341,856 | B1 |  | 1/2002  | Thompson et al. .......... 347/100 |
| 6,354,209 | B1 |  | 3/2002  | Van Aert et al. ............ 101/466 |
| 6,357,352 | B1 |  | 3/2002  | Rorke et al. ................ 101/457 |

(Continued)

FOREIGN PATENT DOCUMENTS

DE 210 132 * 5/1984

(Continued)

OTHER PUBLICATIONS

International Search Report and Written Opinion of the International Searching Authority or the Declaration, for Application No. PCT/US2005/036243, dated Jun. 29, 2006.

(Continued)

*Primary Examiner*—Cynthia H Kelly
*Assistant Examiner*—Anca Eoff
(74) *Attorney, Agent, or Firm*—Goodwin Procter LLP

(57) ABSTRACT

Lithographic printing plates are imaged using an inkjet printer to imagewise apply a chemical or masking agent onto the plate surface. In some embodiments, the chemical inhibits a photoreaction in the top layer.

30 Claims, 3 Drawing Sheets

U.S. PATENT DOCUMENTS

| | | | |
|---|---|---|---|
| 6,367,383 B1 | 4/2002 | Leenders et al. | 101/465 |
| 6,397,749 B1 | 6/2002 | Kita et al. | 101/457 |
| 6,410,205 B1 | 6/2002 | Leichsenring et al. | 430/273.1 |
| 6,413,700 B1 | 7/2002 | Hallman et al. | 430/302 |
| 6,443,569 B1 | 9/2002 | Mheidle et al. | 347/100 |
| 6,451,491 B1 * | 9/2002 | Dhillon et al. | 430/18 |
| 6,455,132 B1 | 9/2002 | Aurenty et al. | 428/195 |
| 6,457,413 B1 | 10/2002 | Loucufier et al. | 101/466 |
| 6,474,235 B2 | 11/2002 | DeBoer et al. | 101/465 |
| 6,482,571 B1 | 11/2002 | Teng | 430/302 |
| 6,490,975 B1 | 12/2002 | Rorke et al. | 101/467 |
| 6,497,178 B1 | 12/2002 | Rorke et al. | 101/457 |
| 6,523,472 B1 | 2/2003 | Loucufier et al. | 101/466 |
| 6,523,473 B2 | 2/2003 | Loucufier et al. | 101/466 |
| 6,526,886 B2 | 3/2003 | Loccufier et al. | 101/466 |
| 6,575,094 B2 * | 6/2003 | Miwa et al. | 101/458 |
| 6,596,462 B2 | 7/2003 | Mori | 430/272.1 |
| 6,596,464 B2 | 7/2003 | Van Damme et al. | 430/302 |
| 6,612,692 B2 | 9/2003 | Lawrence et al. | 347/105 |
| 6,637,336 B2 | 10/2003 | Suda et al. | 101/465 |
| 6,662,723 B2 | 12/2003 | Loccufier et al. | 101/465 |
| 6,691,618 B2 | 2/2004 | Deutsch et al. | 101/465 |
| 2001/0008740 A1 | 7/2001 | Kita | 347/65 |
| 2001/0053435 A1 * | 12/2001 | Ishii et al. | 428/195 |
| 2002/0006558 A1 | 1/2002 | Kobayashi et al. | 430/7 |
| 2002/0015902 A1 | 2/2002 | Yau et al. | 430/14 |
| 2002/0054981 A1 | 5/2002 | Deutsch et al. | 428/195 |
| 2002/0088772 A1 | 7/2002 | Deutsch et al. | 216/83 |
| 2002/0104455 A1 | 8/2002 | Deutsch et al. | 101/463.1 |
| 2002/0121208 A1 | 9/2002 | DeBoer et al. | 101/465 |
| 2002/0122105 A1 | 9/2002 | Loccufier et al. | 347/96 |
| 2002/0132188 A1 | 9/2002 | Ray et al. | 430/302 |
| 2002/0136987 A1 | 9/2002 | Oshima | 430/281.1 |
| 2002/0142250 A1 | 10/2002 | Kita et al. | 430/302 |
| 2003/0005838 A1 | 1/2003 | Damme et al. | 101/465 |
| 2003/0007052 A1 | 1/2003 | Huang et al. | |
| 2003/0036019 A1 | 2/2003 | Teng | 430/302 |
| 2003/0082476 A1 | 5/2003 | Damme et al. | 430/188 |
| 2003/0113654 A1 | 6/2003 | Savariar-Hauck | 430/165 |
| 2003/0118849 A1 | 6/2003 | Yamasaki et al. | 428/447 |
| 2003/0157417 A1 | 8/2003 | Friedman et al. | 430/18 |
| 2003/0186162 A1 | 10/2003 | Takahashi et al. | 430/270.1 |
| 2003/0205158 A1 | 11/2003 | Suda et al. | 101/463.1 |
| 2003/0226462 A1 | 12/2003 | Latunksi et al. | 101/457 |
| 2004/0018443 A1 * | 1/2004 | Aoshima | 430/270.1 |
| 2004/0018447 A1 | 1/2004 | Simons et al. | 430/302 |
| 2004/0020388 A1 | 2/2004 | Simons et al. | 101/463.1 |
| 2004/0021707 A1 | 2/2004 | Simons et al. | 347/2 |
| 2004/0038152 A1 | 2/2004 | Goodin et al. | 430/302 |
| 2004/0154489 A1 | 8/2004 | Deutsch et al. | 101/463.1 |
| 2004/0202955 A1 * | 10/2004 | Goodin | 430/269 |
| 2005/0139108 A1 | 6/2005 | Ray et al. | |

FOREIGN PATENT DOCUMENTS

| | | | |
|---|---|---|---|
| EP | 0 568 841 | | 4/1993 |
| EP | 0 720 054 | A | 7/1996 |
| EP | 0 776 763 | A | 6/1997 |
| EP | 0 845 709 | A | 6/1998 |
| EP | 1 211 064 | A | 6/2002 |
| EP | 0858905 | | 11/2002 |
| EP | 1 434 102 | * | 12/2002 |
| EP | 1 386 730 | A | 2/2004 |
| GB | 1453681 | | 10/1976 |
| JP | 09031865 | | 2/1997 |
| WO | WO 94/18005 | * | 8/1994 |
| WO | 02/081212 | | 10/2002 |
| WO | 2004/082956 | | 9/2004 |

OTHER PUBLICATIONS

Office Action dated Aug. 1, 2006 for PTK-236B, U.S. Appl. No. 11/249,033.

Office Action dated Jan. 8, 2007 for PTK-236D, U.S. Appl. No. 11/249,169.

Communication pursuant to Article 94(3) from the European Patent Office, dated Jan. 28, 2009, 6 pgs.

* cited by examiner

INKJET-IMAGEABLE LITHOGRAPHIC PRINTING MEMBERS AND METHODS OF PREPARING AND IMAGING THEM

CROSS-REFERENCE TO RELATED APPLICATION

This application claims priority to and the benefits of U.S. Provisional Application Ser. No. 60/617,695, filed on Oct. 12, 2004, the entire disclosure of which is hereby incorporated by reference.

FIELD OF THE INVENTION

The present invention relates in general to lithography, and more particularly to lithographic printing members suitable for inkjet imaging.

BACKGROUND OF THE INVENTION

In offset lithography, a printable image is present on a printing member as a pattern of ink-accepting (oleophilic) and ink-rejecting (oleophobic) surface areas. Once applied to these areas, ink can be efficiently transferred to a recording medium in the imagewise pattern with substantial fidelity. Dry printing systems utilize printing members whose ink-repellent portions are sufficiently phobic to ink as to permit its direct application. In a wet lithographic system, the non-image areas are hydrophilic, and the necessary ink-repellency is provided by an initial application of a dampening fluid to the plate prior to inking. The dampening fluid prevents ink from adhering to the non-image areas, but does not affect the oleophilic character of the image areas. Ink applied uniformly to the printing member is transferred to the recording medium only in the imagewise pattern. Typically, the printing member first makes contact with a compliant intermediate surface called a blanket cylinder which, in turn, applies the image to the paper or other recording medium. In typical sheet-fed press systems, the recording medium is pinned to an impression cylinder, which brings it into contact with the blanket cylinder.

Lithographic plates can be fabricated in various ways, ranging from traditional manual techniques involving photo-exposure and chemical development to automated procedures involving computer control. Computer-to-plate systems can utilize pulses of electromagnetic radiation, produced by one or more laser or non-laser sources, to create physical or chemical changes at selected points of sensitized plate blanks (which, depending on the system, may be used immediately or following conventional photodevelopment); ink-jet equipment used to selectively deposit ink-repellent or ink-accepting spots on plate blanks; or spark-discharge equipment, in which an electrode in contact with or spaced close to a plate blank produces electrical sparks to alter the characteristics of certain areas on a printing surface, thereby creating "dots" which collectively form a desired image. To circumvent the cumbersome photographic development, plate-mounting, and plate-registration operations that typify traditional printing technologies, practitioners have developed electronic alternatives that store the imagewise pattern in digital form and impress the pattern directly onto the plate.

Digital imaging of printing plates by inkjet printing is currently widely investigated; see, e.g., U.S. Pat. Nos. 6,526,886 and 6,691,618. The '618 patent, for example, discloses a method of imaging a lithographic printing plate having an alkaline-soluble polymeric coating with a pH-elevating agent. The need to use alkaline solutions to develop these plates, however, poses environmental and safety problems. It would be desirable to have inkjet-imageable lithographic printing plates that can be solely developed by water, or which do not require a development step.

SUMMARY OF THE INVENTION

The present invention relates to lithographic printing members imageable using a combination of inkjet and photopolymerization. An advantage to this approach is the durability of photopolymer plates and the ability to utilize conventional ultraviolet (UV) imaging sources.

Accordingly, in a first aspect, the invention provides a lithographic printing member having a photosensitive top layer, an optional crosslinked intermediate layer, and a substrate thereunder, as well as methods of imaging such a printing member. The top layer contains a photo-polymerizable moiety and the first component of a two-component photo-polymerization initiating system. When reacted with an imaging fluid containing the second component of the two-component photo-polymerization initiating system and thereupon subjected to actinic radiation, the top layer undergoes photopolymerization and becomes crosslinked. In some embodiments, the top layer is oleophilic and the substrate (or intermediate layer) is hydrophilic, whereas in other embodiments, the top layer is hydrophilic and the substrate (or intermediate layer) is oleophilic.

To provide a lithographic image, the imaging fluid is dispensed onto the top layer of the printing member in an imagewise pattern. The imaged plate is then exposed to actinic radiation, allowing the imaging fluid to react with the photosensitive top layer and form a crosslinked imaged area. The imaged printing member is then subjected to a solvent, such as an aqueous fluid, to remove non-image (i.e., uncrosslinked), portions of the top layer, leaving an imagewise lithographic pattern on the printing member ready for inking.

Suitable photo-polymerizable moieties for forming the top layer include, but are not limited to, multifunctional acrylic monomers, oligomers, macromers, and combinations thereof. A suitable two-component photo-polymerization initiating system that can be used to prepare the top layer and the imaging fluid is a hexaarylbiimidazole dimer with a free-radical-producing electron donor agent as a co-catalyst. Although none of these compounds dissolves in water, it is believed that because the functional moieties only weakly adhere to the hydrophilic intermediate layer underneath, water may be applied to the top layer to disrupt the weak adhesion between the top and underlying layers, thereby allowing the removal of the non-image portions of the top layer. On the other hand, adhesion between the imaged areas, i.e., where photopolymerization and crosslinking have occurred, and the underlying layer is sufficiently strong that the imaged portions cannot be removed by water in the development step.

In a second aspect, the invention provides a printing member having a soluble top layer, an optional intermediate layer, and a substrate thereunder, as well as methods of imaging such a printing member. The top layer, which contains a photoreactive reagent, becomes crosslinked and water-insoluble when exposed to actinic radiation. An imaging fluid that contains at least one of a photoreaction-inhibiting agent and a masking agent may be applied to the top layer, reducing or totally inhibiting the reactivity of the photoreactive reagent and thereby preventing the imaged areas from undergoing crosslinking. In some embodiments, the top layer is oleophilic and the substrate (or intermediate layer) is hydrophilic, whereas in other embodiments, the top layer is hydrophilic and the substrate (or intermediate layer) is oleophilic.

To provide a lithographic image, the imaging fluid is dispensed onto the top layer of the printing member in an imagewise pattern. The imaged plate is then exposed to actinic radiation, which induces crosslinking in the non-image areas, causing these areas to become water-insoluble. On the other hand, because the jetted fluid has masked the imaged portions from light and/or reacted within the imaged portions of the top layer to reduce its photoreactivity, crosslinking does not occur in the imaged areas and a water-soluble image is formed in the top layer. The imaged printing member is then subjected to a solvent, such as an aqueous fluid, to remove the imaged portions, leaving an imagewise lithographic pattern on the printing member ready for inking.

The photoreactive reagent found in the top layer can be a photo-crosslinking agent or a photo-polymerization initiator. Suitable photo-crosslinking agents include various bis-azides. Water-soluble polymers that can be crosslinked by bis-azides include, but are not limited to, polyvinyl pyrrolidone, copolymers of vinyl pyrrolidone, acrylamide-diacetone acrylamide copolymer, polyacrylamide, copolymers of acrylamide, gelatin, and mixtures thereof.

An alternative photo-crosslinking agent is a condensation product of an aromatic diazonium salt and a condensation agent. Suitable aromatic diazonium salts include, but are not limited to, 4-diazodiphenylamine sulfate, 3-methoxy-4-diazodiphenylamine sulfate, 4-phenoxydiazobenzene zinc chloride double salt, and 2,5-dimethoxy-4-tolylmercaptodiazobenzene zinc chloride double salt. Water-soluble polymers that can be crosslinked by an aromatic diazonium salt-containing compound include, but are not limited to, polyvinyl alcohol, carboxymethylcellulose, hydroxymethylcellulose, hydroxyethylcellulose, hydropropylpropylcellulose, polyacrylic or methacrylic acid, polyvinyl pyrrolidone, copolymers of vinyl pyrrolidone, polyacrylamide, copolymers of polyacrylamide, gelatin, and mixtures thereof.

Suitable photo-polymerization initiators include those that are water-soluble. Examples include, but are not limited to, ceric ammonium oxalate, manganic ammonium oxalate, and photoreducible dyes and their co-catalysts. Another useful photoreactive reagent is a polyvinyl alcohol comprising a stilbazolium moiety.

The imaging fluid may contain a photoreaction-inhibiting agent such as an antioxidant. Suitable antioxidants include, but are not limited to, hydroquinone, 4-methoxyphenol, 2,6-di-(t-butyl)-4-methylphenol, 2,2'-methylenebis-(4-methyl-6-t-butylphenol), diesters of thiodipropionic acid, and triarylphosphite. Alternatively, the imaging fluid may contain a masking agent that shields the imaged area from exposure to actinic radiation. Suitable masking agents include various dyes and pigments that absorb at wavelengths of photosensitivity of the photosensitive top layer. Examples include, but are not limited to, Acid Yellow 25 (C.I. 18835), Acid Yellow 29 (C.I. 18900), Acridine Yellow G (C.I. 46025), Basic Yellow 2 (C.I. 41000), Acid Black 2 (C.I. 50420), and aqueous dispersions of carbon black and yellow pigments. An imaging fluid that contains both a masking agent and a photoreaction-inhibiting agent may also be used according to the invention.

It should be stressed that, as used herein, the term "plate" or "member" refers to any type of printing member or surface capable of recording an image defined by regions exhibiting differential affinities for ink and/or fountain solution. Suitable configurations include the traditional planar or curved lithographic plates that are mounted on the plate cylinder of a printing press, but can also include seamless cylinders (e.g., the roll surface of a plate cylinder), an endless belt, or other arrangement.

Furthermore, the term "hydrophilic" is used in the printing sense to connote a surface affinity for a fluid which prevents ink from adhering thereto. Such fluids include water for conventional ink systems, aqueous and non-aqueous dampening liquids, and the non-ink phase of single-fluid ink systems. Thus a hydrophilic surface in accordance herewith exhibits preferential affinity for any of these materials relative to oil-based materials.

The term "fountain solution," as used herein, pertains to a solution used to clean or remove the water-soluble portions of the imaged printing members of the methods of this invention and may be water, combinations of at least 90% water and 10% or less organic solvents and additives such as alcohols, surfactants, and glycols, and buffered or salt-containing neutral or nearly neutral water solutions. The term "fountain solution," as used herein, does not include alkaline aqueous solutions with a pH of greater than about 10, acidic aqueous solutions with a pH of less than about 3.5, or organic solvents without at least 90% by weight of water present.

Also, as used herein, the term "water-soluble" refers to a material that can form a greater than 1% solution in water or a mixture of a water-miscible solvent such as alcohol and water wherein the mixture is more than 50% water.

As one of skill in the art will appreciate, features of one embodiment and aspect of the invention are applicable to other embodiments and aspects of the invention. The above-discussed and other features and advantages of the present invention will be appreciated and understood by those skilled in the art from the following detailed description and drawings.

BRIEF DESCRIPTION OF THE DRAWINGS

The foregoing discussion will be understood more readily from the following detailed description of the invention when taken in conjunction with the accompanying drawings.

Figure 1:
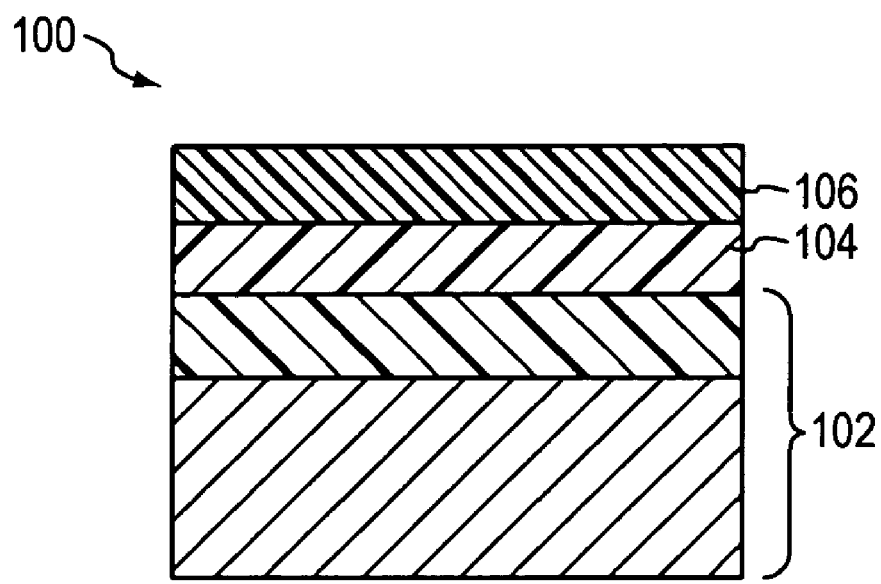
FIG. 1 is an enlarged sectional view of an embodiment of a negative-working printing member according to the invention that contains substrate, a crosslinked hydrophilic intermediate layer, and a photosensitive oleophilic top layer.

The drawings and elements thereof may not be drawn to scale.

DETAILED DESCRIPTION OF THE INVENTION

1. Imaging Apparatus

An imaging apparatus suitable for use in conjunction with the present printing members includes at least an inkjet printer. To facilitate accurate imaging of the printing members according to the invention, the paper-handling or substrate-handling subsystem of the inkjet printer should have a short, straight paper path. A printing plate is generally stiffer and heavier than the paper or media typically used in commercially available inkjet printers. If the construction of the printer requires the printing plate to be bent before or after it is presented to the imaging print head, then the movement of the printing plate through the printer may not be as accurate as the media for which the printer was designed. Printers such as the EPSON STYLUS COLOR 3000 (available from Epson America, Inc., Long Beach, Calif.) have a suitably short, straight paper path. A platen is preferably placed at the entrance to the paper feed mechanism. The platen may have a registration guide rail to support the plate as it is pulled into the printer by the feed mechanism, facilitating the accurate transport of the plate under the imaging print head.

The imaging apparatus may further include a developing processor for embodiments where off-press development of the imaged plate is envisioned. U.S. Pat. No. 6,691,618, for example, describes a suitable developing processor. The development process may involve conveying the imaged plate through a series of stations, which may include a hot air dryer, a pre-heat oven, a development station, a rinse station, and a post-bake oven. The plate is ready to be used on press after this off-press developing step.

In other embodiments, the imaged plate can be developed on-press. In these embodiments, after imaging of the printing member, no conventional development of the latent image is required. Instead, the plate is first heated in an oven to dry the image and, typically, to complete the reaction with the imaging fluid. Second, the plate is mounted on the plate cylinder of a conventional offset lithographic press. Third, the latent image is developed by operating the press such that the plate cylinder is rotated and the working fluids of the press, i.e., the press ink and fountain solution, are applied to the plate. The plate is then ready to be used to print images on paper or other media by the normal operation of the press.

2. Inkjet Printing Process

Inkjet printing involves projecting tiny drops of ink fluid directly onto the plate surface without physical contact between the inkjet printer and the plate. The inkjet printer stores electrical data corresponding to the image to be printed (specifically, the image or background area, depending on whether the plate is positive-working or negative-working), and controls a mechanism for ejecting ink droplets imagewise onto the plate. Printing is performed by moving the print head across the plate or vice versa.

There are generally two mechanisms that commercially available inkjet printers utilize to control how ink droplets are jetted. In continuous inkjet printing, the print head propels a continuous stream of ink through a nozzle. This stream is broken down into identical droplets, which are then selectively charged. Depending on the construction of the printer, either the charged or the uncharged droplets are deflected and guided towards the receiving medium. The undeflected droplets are collected and recycled. Continuous inkjet printers require complex hardware, but they offer high speed printing as an advantage.

In drop-on-demand inkjet printers, ink droplets are generated and ejected through the orifices of the print head only as needed. Some drop-on-demand systems use a thermal process to create the pressure required to eject ink droplets. These thermal jet (or bubble jet) printers use heat to generate vapor bubbles in a volatile component of the ink fluid. As these bubbles build up pressure and vaporize, ink droplets are jetted out of the print head one at a time. Other drop-on-demand systems utilize a piezoelectric actuator to eject ink droplets. In these printers, a computer signal imposes an electrical potential across a piezoelectric material which causes it to deform. Ink droplets are ejected as the piezoelectric material deforms and returns to its normal dimensions. Although drop-on-demand inkjet printers have relatively slow printing speed, they offer small drop size and highly controlled ink droplet placement.

The imaging step according to the invention can be performed by any suitable inkjet printers and techniques described above. Commercially available drop-on-demand models are preferred, however, because of their durability and high resolution.

3. Lithographic Printing Members

Figure 2:
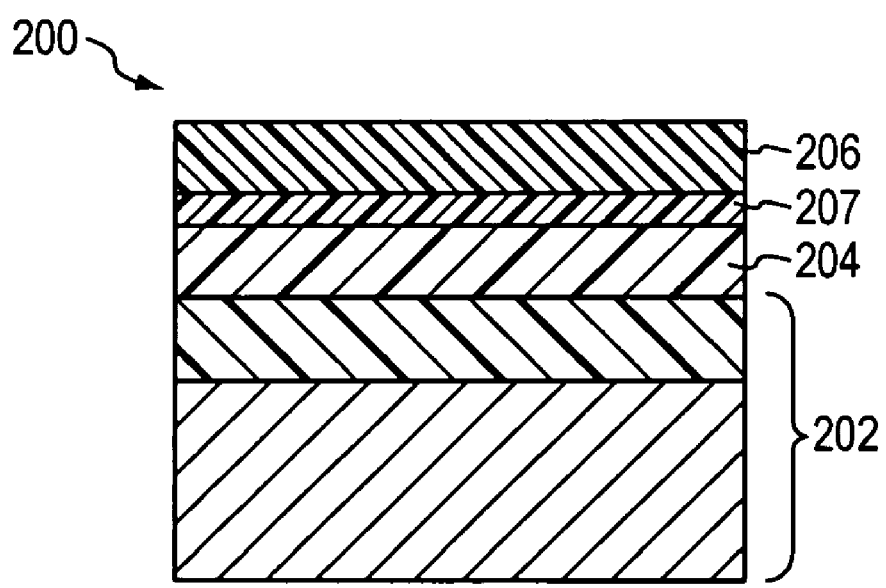
FIG. 2 is an enlarged sectional view of an embodiment of a positive-working printing member according to the invention that contains substrate, an oleophilic intermediate layer, an optional adhesive layer, and a water-soluble hydrophilic top layer that is photosensitive.

A representative printing member according to the invention includes a substrate, an optional intermediate layer, and a top layer. FIG. 1 illustrates an embodiment of a printing member 100 according to the invention that includes a substrate 102, a crosslinked intermediate layer 104, and a photosensitive top layer 106 that is chemically reactive with an inkjet imaging fluid 108 (see FIGS. 3A-3D). In a negative-working version, the intermediate layer 104 is hydrophilic and the photosensitive top layer 106 is oleophilic. In a positive-working version, the intermediate layer 104 is oleophilic and the photosensitive top layer 106 is hydrophilic. FIG. 2 illustrates an embodiment of a printing member 200 according to the invention that includes a substrate 202, an intermediate layer 204, an optional adhesive layer, and a soluble top layer 206 that is photosensitive and chemically reactive with an inkjet imaging fluid 208 (see FIGS. 4A-4D). In a positive-working version, the intermediate layer 204 is oleophilic and the top layer 206 is hydrophilic. In a negative-working version, the intermediate layer 204 is hydrophilic and the top layer 206 is oleophilic.

Each of these layers and their functions will be described in detail below.

3.1 Substrate 102, 202

The substrate provides dimensionally stable mechanical support to the printing member. The substrate should be strong, stable and, preferably, thin and flexible. One or more surfaces of the substrate can be either hydrophilic or oleophilic. Suitable substrate materials include, but are not limited to, metals, polymers, and paper.

Metals suitable for use in substrates according to the invention include, but are not limited to, aluminum, zinc, steel, chromium, and alloys thereof, which may have another metal (e.g., copper) plated over one surface. Metal substrates can have thicknesses ranging from about 50 μm to about 500 μm or more, with thicknesses in the range of about 100 μm to about 300 μm being preferred.

One or more surfaces of a metal substrate may be anodized. Anodizing increases the hardness and abrasion resistance of the metal surface, which improves the mechanical strength of the substrate. The anodic layer can also control dissipation of heat into the substrate, thus increasing the imaging efficiency of the printing member. An anodized aluminum substrate consists of an unmodified base layer and a porous, anodic aluminum oxide coating thereover. The anodized aluminum surface is hydrophilic; however, without further treatment, the oxide coating would lose wettability due to further chemical reaction. Anodized substrates are, therefore, typically exposed to a silicate solution or other suitable reagent (e.g., a phosphate reagent) that stabilizes the hydrophilic character of the plate surface. In the case of silicate treatment, the surface may assume the properties of a molecular sieve with a high affinity for molecules of a definite size and shape—including, most importantly, water molecules.

A preferred substrate is an anodized aluminum plate with a low degree of graining and an anodic layer having a thickness between about 0.5 µm and about 3 µm (available, for example, from Precision Lithograining Corp., South Hadley, Mass.). Graining can be achieved by methods known in the art such as by means of a wire brush, a slurry of particulates or by chemical or electrolytic means.

Polymers suitable for use in substrates according to the invention include, but are not limited to, polyesters (e.g., polyethylene terephthalate and polyethylene naphthalate), polycarbonates, polyurethane, acrylic polymers, polyamide polymers, phenolic polymers, polysulfones, polystyrene, and cellulose acetate. A preferred polymeric substrate is a polyethylene terephthalate film such as MYLAR and MELINEX (available from E.I. duPont de Nemours Co., Wilmington, Del.).

Polymeric substrates can be coated with a transition layer to improve the mechanical strength and durability of the substrate and/or to alter the hydrophilicity or oleophilicity of the surface of the substrate. A hydrophilic transition layer may include porous materials with oxygen functional groups at the surface. The addition of hydrophilic fillers such as, for example, silica particles, also enhances the hydrophilicity of the transition layer. Examples of suitable materials for hydrophilic transition layers according to the invention include proprietary hard coat materials supplied by Bekaert Specialty Films, LLC (San Diego, Calif.). Other suitable formulations and application techniques for transition layers are disclosed, for example, in U.S. Pat. No. 5,339,737, the entire disclosure of which is hereby incorporated by reference.

Polymeric substrates can have thicknesses ranging from about 50 µm to about 500 µm or more, depending on the specific printing member application. For printing members in the form of rolls, thicknesses of about 200 µm are preferred. For printing members that include transition layers, polymer substrates having thicknesses of about 50 µm to about 100 µm are preferred.

A wide variety of papers may be utilized as a substrate. Typically, papers are saturated with a polymeric treatment to improve dimensional stability, water resistance, and strength during wet lithographic printing.

In embodiments of the invention that do not include an intermediate layer between the top layer and the substrate, the substrate and the top layer (subsequent to reaction with the imaging fluid) generally have opposite affinities for ink and/or a liquid to which ink will not adhere. In embodiments that do contain an intermediate layer, on the other hand, the substrate and the top layer (subsequent to reaction with the imaging fluid) need not have opposite lithographic affinities. Instead, the intermediate layer is designed to have a lithographic affinity opposite to that of the reacted top layer, as described below. However, it is generally preferable to provide a substrate and an intermediate layer of like affinities to promote adhesion and to accommodate damage to the intermediate layer without loss of performance. Specifically, even though the intermediate layer is typically not soluble in aqueous solutions and is not removed during the imaging process, it can still be scratched or damaged during the printmaking process. A substrate of like affinity will accept or reject ink in the same manner as the overlying intermediate layer in those areas where the intermediate layer is damaged, thus maintaining print quality and prolonging the press life of the printing member.

3.2 Intermediate Layer 104, 204

The intermediate layer is coated on the substrate. In embodiments where a polymeric substrate is used, the intermediate layer can be the transition layer described above. The intermediate layer can be either hydrophilic or oleophilic, provided that it has an affinity opposite to that of the top layer after the top layer has reacted with the imaging fluid for at least one of ink and a liquid to which ink will not adhere. It should generally adhere well to the substrate and to the top layer and should withstand repeated application of fountain solution or ink during printing without substantial degradation or solubilization. The intermediate layer is optional in some embodiments.

Suitable materials for fabricating a hydrophilic intermediate layer include, but are not limited to, polyvinyl alcohol, polyacrylamide, polyvinyl pyrrolidone, and cellulosics. Polyvinyl alcohol is preferred. Homopolymers and copolymers with amine, carboxylic acid, sulfonic acid, and/or phosphonic acid moieties can also be used. Specific examples include homopolymers and copolymers of vinyl alcohol with amino-functional groups, vinyl phosphonic acid, acrylamide, methylol acrylamide, methylol methacrylamide, acrylate acid, methacrylate acid, hydroxyethyl acrylate, hydroxyethyl methacrylate, and maleic anhydride/vinylmethylether copolymers. A polyceramic layer containing PVOH-ZrOH (see, e.g., U.S. Pat. Nos. 6,182,569, 6,182,570, and 6,186,067) can also be used.

To increase toughness and wear resistance, the hydrophilic polymer coating is preferably crosslinked. Crosslinking agents such as formaldehyde, glyoxal, polyisocynate, melamine-type crosslinkers, ammonium zirconyl carbonate, titanate crosslinkers, hydrolyzed tetraalkylorthosilicate, and diepoxide crosslinkers can be added to crosslink specific functional groups in the polymer. For example, diepoxide crosslinkers can effectively crosslink amino groups and carboxylic acid groups. Polyvinyl alcohol can be crosslinked by hydrolyzed tetraethoxysilane according to procedures described in U.S. Pat. No. 3,971,660, by ammonium zirconium carbonate as described in U.S. Pat. No. 6,490,975, and by melamine with a catalyst such as an organic sulfonic acid.

The mechanism of the crosslinking reaction is not critical. For example, either radical-initiated crosslinking or oxidative crosslinking may be used.

In embodiments of the invention that include an oleophilic intermediate layer, the materials used in the oleophilic coating should demonstrate good adhesion to the substrate below it and to the hydrophilic coating that is to be applied on top of it. Their oleophilic properties should be such that, when placed on a press, the imaged areas accept ink immediately. Run lengths in the order of thousands of impressions are preferred. The oleophilic materials should therefore have suitable toughness, wear resistance, and be non-reactive with the ink.

Many homopolymers and copolymers can be used as the oleophilic intermediate layer according to the invention. They include polyurethanes, epoxy resins, polystyrene, copolymers of styrene, acrylics, copolymers of acetate and ethylene, polyacrylics, copolmyers of acrylics, polyvinyl acetate, phenol and cresol formaldehyde resins, cellulose ethers and esters, polyvinyl acetals, diazo resins, and synthetic rubbers. They can be applied from a solvent solution, or can be used in the form of an aqueous resin dispersion and be applied from water. Intermediate layers made from aqueous resin dispersions can be heat-treated to cause the dispersed resin particles to coalesce, which increases their toughness. In addition, commercially available subtractive coatings (e.g., subtractive plate NSSH manufactured by Precision Lithograining, South Hadley, Mass.) with or without blanket light exposure can be used as the oleophilic coating.

Other components that can be included in the intermediate layer are colorants, plasticizers, surfactants, crosslinking agents and monomers including initiators. The latter two are added to increase toughness and can be activated by either heat or light.

3.3 Top Layer 106, 206

The top layer receives the imaging fluid and is photosensitive as described below. Materials utilized in this layer should exhibit good adhesion to the layer below it, i.e., the intermediate layer or the substrate.

Materials forming the top layer can be applied to the intermediate layer (or, in embodiments where the intermediate layer is optional, the substrate) in any suitable manner using conventional coating equipment and procedures. Upon drying, the top layer is generally at least 0.1 µm in thickness and can be as thick as 10 µm. Thus, in negative-working embodiments of the present invention, the top layer should be thick and substantially continuous enough to provide the desired image upon fluid application, but not so thick that the non-image areas are difficult to remove after imaging. Similarly, in positive-working embodiments of the present invention, the top layer should not be so thick that the imaged areas are difficult to remove after imaging.

Apart from the components capable of reacting with the imaging fluid, the top layer may also contain various additives, e.g., nonionic and/or amphoteric surfactants, as appropriate to the application. Specific examples of the nonionic surfactant include sorbitan tristearate, sorbitan monopalmitate, sorbitan trioleate, stearic acid monoglyceride, polyoxyethylene nonylphenyl ether, and the like. Specific examples of amphoteric surfactants include alkyldi(aminoethyl)glycine, hydrochloric acid salt of alkylpolyaminoethylglycine, 2-alkyl-N-carboxyethyl-N-hydroxyethylimidazolinum betaine, N-tetradecyl-N,N-betaine, and the like.

Dyes can be added in a small amount to adjust the plate color. Specific examples of these dyes include Oil Yellow No. 101, Oil Yellow No. 103, Oil Pink No. 312, Oil Green BG, Oil Blue BOS, Oil Blue N. 603, Oil Black BY, Oil Black BS, Oil Black T-505 (all marketed by Chemical Industries, Co., Des Moine, Iowa), Victoria Pure Blue, Crystal Violet (C.I. 42555), Methyl Violet (C.I. 42535), Ethyl Violet, Rhodamine B (C.I. 145170B), Malachite Green (C.I. 42000), Methylene Blue (C.I. 52015), and the like.

Further, if necessary, a plasticizer may be added to impart flexibility to the top layer. Examples of suitable plasticizers include butyl phthalyl, polyethylene glycol, tributyl citrate, diethyl phthalate, dibutylphthalate, dihexyl phthalate, dioctyl phthalate, tricresyl phosphate, tributyl phosphate, trioctyl phosphate, tetrahydrofurfuryl oleate, an oligomer or a polymer of acrylic acid or methacrylic acid, and the like.

Specific embodiments of the top layer are discussed below.

3.4 Inkjet Imaging Fluid 108, 208

The inkjet imaging fluid contains at least one chemical compound in its composition which is either capable of reacting with, or inhibiting a reaction in, the top layer. The chemical compound(s) may be present in the imaging fluid in a concentration as high as 20% or even higher by weight, but preferably less than 5% by weight. It is also preferable, although not necessary, that the chemical compound(s) be in the form of a homogeneous solution or a stable colloidal dispersion, so that it can pass through the nozzles of an inkjet print head.

The main liquid carrier can be water or an organic solvent or combinations thereof. The choice of the liquid carrier depends on the specific inkjet printer. Both aqueous-based and solvent-based fluids can be used in the present invention depending on the inkjet technology that is being used (i.e., piezo, thermal, bubble jet or continuous inkjet).

While water is the preferred medium for aqueous imaging fluids, the aqueous composition may comprise one or more miscible co-solvents, e.g., a polyhydric alcohol. These co-solvents may be high-boiling humidifying solvents such as glycerin, propylene glycol, ethxylated glycerin, ethylene glycol, propylene glycol, diethylene glycol, triethylene glycol, propylene glycol, dipropylene glycol, and trimethylol propane. The purpose of adding one or more high-boiling humidifying solvents is to prevent the imaging fluid from drying during idle periods which could cause the inkjet nozzles to clog. Other high-boiling solvents can be added to improve the solubility of the chemical compound tailored to react with the top layer. Such solvents may include, but are not limited to, methylpyrrolidone, propylene glycol monoethyl ether, propylene glycol monobutyl ether, and propylene glycol ethyl ether acetate. The amount of aqueous carrier medium in the aqueous composition may be in the range from 30 to 99.995% by weight, preferably from 50 to 95% by weight.

Organic solvents that may be used as a carrier medium for the inkjet imaging fluid include, but are not limited to, alcohols, ketones or acetates.

As known in the art of the inkjet technology, the jet velocity, separation length of the droplets, drop size and stream stability is greatly affected by the surface tension and the viscosity of the aqueous composition. Inkjet imaging fluids suitable for use with inkjet printing systems may have a surface tension in the range from 20 to 60 dyne/cm, and preferably from 30 to 50 dyne/cm. Control of surface tensions in aqueous inkjet fluids may be accomplished by additions of small amounts of surfactants. The level of surfactants to be used can be determined through simple empirical experiments. Several anionic and nonionic surfactants are known in the inkjet art. Commercial surfactants include the SURFYNOL series, e.g., SURFYNOL 104, SURFYNOL 45, SURFYNOL FS-80, SURFYNOL PSA-216 (available from Air Products, Allentown, Pa.); the DYNOL series, e.g., DYNOL 604 (available from Air Products, Allentown, Pa.); the TRITON series, e.g., TRITON X-100 (available from Rohm and Haas, Philadelphia, Pa.); the ZONYL series (available from E.I. duPont de Nemours Co., Wilmington, Del.); the FLUORAD series (available from Minnesota Mining and Manufacturing Co., St. Paul, Minn.); the AEROSOL series (available from American Cyanamid Co., Wayne, N.J.); and similar chemicals. The viscosity of the fluid is preferably not greater than 20 mPA·s, e.g., from 1 to 10 mPA·s, preferably from 1 to 5 mPA·s at room temperature.

The inkjet imaging fluid may further comprise other ingredients. A biocide may be added to prevent unwanted microbial growth which may occur in the fluid over time, and which would otherwise degrade the shelf life of the fluid. Suitable biocides include, but are not limited to, PROXEL GXL (available from Zeneca Specialties, Manchester, UK), sodium OMADINE (available from Olin Mathieson Chemical Corp., New York, N.Y.), GIVGARD DXN (available from Givaudan Corp., New York, N.Y.), solution of 1,2-benzothiazoline-3-one, sodium hydroxide and dipropylene glycol, 2-pyridinethiol-1-oxide, sodium salt, DOWICIL (available from Dow Chemical, Midland, Mich.), cis-1-(3-chloroallyl)-3,5,7-triaza-1-azoniaadamantane chloride, and similar chemicals or mixtures of such chemicals. When used, the biocide will typically be 0.1 to 3% by weight of the ink.

Additional additives that may be optionally present in the ink include thickeners, pH adjusters, buffers, conductivity-enhancing agents, drying agents and defoamers.

Dyes may be added in order to enhance the image contrast after jetting the image on the top layer. Many dyes and pigments are known to be suited for inkjet technology. Suitable dyes are further selected based on their compatibility in the carrier medium (i.e., aqueous-based or solvent-based) and on their compatibility with the reactive chemical compound, e.g., they should not lead to coagulation.

Specific embodiments of the imaging fluids and the compositions of the top layers are discussed below in detail, along with the imaging techniques associated therewith.

4. Imaging Techniques 4.1 Printing Member 100 and Imaging Fluid 108

According to the embodiment illustrated in FIG. 1, the printing member 100 includes a grained, anodized, and/or silicated aluminum substrate 102, a crosslinked intermediate layer 104, and a photosensitive top layer 106 that contains water-insoluble photo-polymerizable moieties. Upon reacting with the imaging fluid 108, imaged areas in the top layer 106 become crosslinkable by exposure to actinic (e.g., UV) radiation.

Although the top layer 106 is water-insoluble, it is found that the printing member 100 can be developed solely with water. Without being bound by any particular theory or mechanism, it is believed that the adhesion between even an oleophilic top layer 106 and a hydrophilic intermediate layer 104 is sufficiently weak that when the plate 100 is exposed to water, the top layer 106 can be easily removed as water molecules disrupt the weak adhesion between the top layer 106 and the intermediate layer 104. It is further believed that after imaging, the imaged areas in the top layer 106, i.e., where crosslinking has occurred, adhere significantly better to the intermediate layer 104, such that these imaged areas cannot be removed by water alone.

Figure 3A:
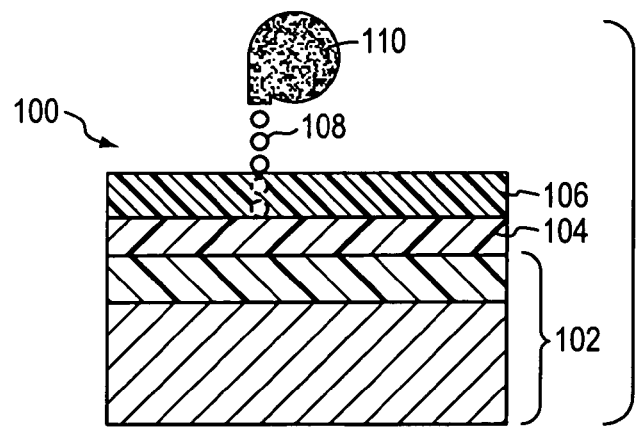
FIGS. 3A-3D are enlarged sectional views of the negative-working printing member of FIG. 1 illustrating an imaging mechanism according to the invention.
Figure 3B:
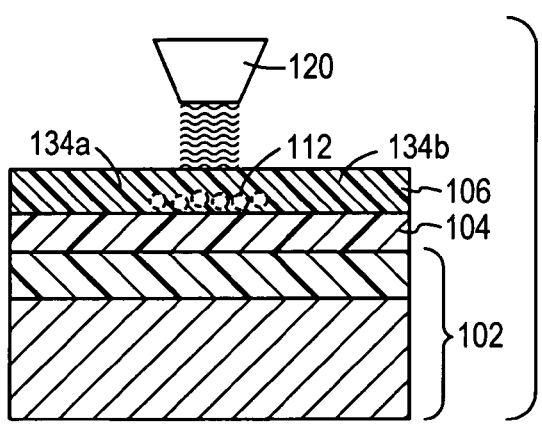
Figure 3C:
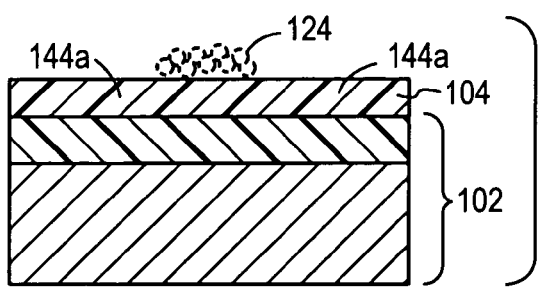
Figure 3D:
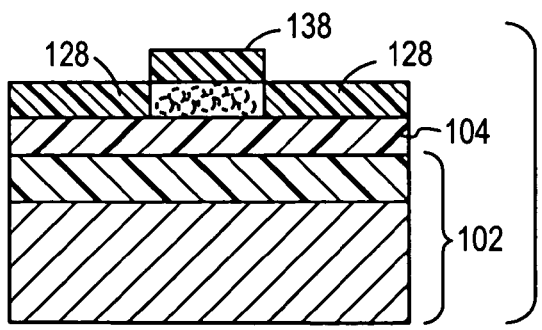

FIGS. 3A-3D illustrate the consequences of imaging an embodiment of the printing member 100. As illustrated in FIG. 3A, an inkjet printer 110 is used to apply droplets of the imaging fluid 108 imagewise onto the photosensitive and oleophilic top layer 106. The imaging fluid 108 wets and penetrates the top layer 106, and creates an imaged area 112. The imaged area 112 is then exposed to a source 120 of actinic radiation, such as a UV lamp, as shown in FIG. 3B. Upon radiation, the imaging fluid 108 reacts with the photosensitive top layer 106 and forms a crosslinked imaged area 124 that exhibits significantly stronger adhesion to the intermediate layer 104 than the non-image, non-crosslinked areas 144a, 144b. FIG. 3C shows that the imaged plate can be developed subsequently either on-press or off-press with water or a fountain solution 128, which disrupts the weak adhesion between the non-image portions 134a, 134b of the top layer 406 and the underlying crosslinked layer 104. As shown in FIG. 3D, in a negative-working version, the fountain solution 128 wets layer 104 but is repelled by the imaged oleophilic area 124, which then accepts printing ink 138.

Suitable materials for forming the top layer 106 according to the invention include a photo-polymerizable moiety, the first component of a two-component photo-polymerization initiating system, and an optional binder. Examples of photo-polymerizable moieties include, but are not limited to, multifunctional acrylic monomers, oligomers, macromers, and combinations thereof. Hydrophilic moieties include polyvinyl alcohol, carboxymethylcellulose, hydroxymethylcellulose, hydroxyethylcellulose, hydropropylpropylcellulose, polyethylene oxide, polyvinyl pyrrolidone, copolymers of vinyl pyrrolidone, polyacrylamide, copolymers of polyacrylamide, gelatin, and mixtures thereof, polystyrene sulfonic acid, polyacrylic or methacrylic acid, and mixtures thereof. Aromatic diazonium salts may be added at low concentrations to to improve adhesion. Inorganic pigments such as silica, alumina, clays, and titanium dioxide may be added to improve the hydrophilic properties. Oleophilic moieties include acrylate, methacrylate, and vinyl compounds of polyesters, polyurethanes, polyepoxides, bisphenol A resins, and phenoxy resins among others.

Suitable polymeric binders include, for example, polystyrene, (meth)acrylic polymers and copolymers (such as polybutylmethacrylate, polyethylmethacrylate, polymethylmethacrylate, polymethylacrylate, butylmethacrylate/methylmethacrylate copolymer), polyvinyl acetate, polyvinyl chloride, styrene/acrylonitrile copolymer, nitrocellulose, cellulose acetate butyrate, cellulose acetate propionate, vinyl chloride/vinyl acetate copolymer, partially hydrolyzed polyvinyl acetate, polyvinyl alcohol partially condensation-reacted with acetaldehyde, butadiene/acrylonitrile copolymer, and polyurethane binder. Also useful are aqueous alkaline-soluble polymers, such as (meth)acrylic polymer with substantial number of carboxylic acid functional groups, polymers with substantial number of phenol groups, and polymers with (meth)acrylate groups and carboxylate salt groups as described in U.S. Pat. No. 5,849,462.

Photo-polymerization initiators are compounds that generate radicals under the influence of added energy from actinic light. Some photo-polymerization initiators require two different components. Examples of such two-component photo-polymerization initiating systems are described in U.S. Pat. Nos. 3,615,567 and 3,479,185, the entire disclosures of which are hereby incorporated by reference. These patents describe a hexaarylbiimidazole dimer as a first component and a free-radical-producing electron donor agent as a second component that act as co-synergists. Suitable free-radical-producing electron donor agents include, for example, methylene chloride, p-aminophenyl ketone, and N-phenylglycine. A preferred two-component photo-polymerization initiating system has 2,4,5-triphenylimidazolyl dimers consisting of two lophine radicals bound together by a single covalent bond and N-phenylglycine as a co-catalyst.

Suitable compositions for inkjet imaging fluid 108 include jettable fluids that contain the second component of the two-component photo-polymerization initiating system that readily reacts with the first component of the photo-polymerization initiating system in the top layer 106 of the printing member 100 upon exposure to light to initiate crosslinking and polymerization in the top layer 106.

4.2 Printing Member 200 and Imaging Fluid 208

In the embodiment illustrated in FIG. 4, the printing member 200 includes a grained, anodized, and/or silicated aluminum substrate 202, an intermediate layer 204, and a soluble (e.g., water-soluble) photosensitive top layer 206. A thin adhesive layer 207 including a diazo resin may optionally be employed between the intermediate layer 204 and the top layer 206. The top layer 206 generally becomes crosslinked and water-insoluble when exposed to actinic radiation. However, in areas of the top layer 206 where it has absorbed the imaging fluid 208, the photoreaction is inhibited and substantially does not take place. In a positive-working version, top layer 206 is hydrophilic and intermediate layer 206 and/or substrate 202 is oleophilic. In a negative-working version, top layer 206 is oleophilic and intermediate layer 206 and/or substrate 202 is hydrophilic.

Figure 4A:
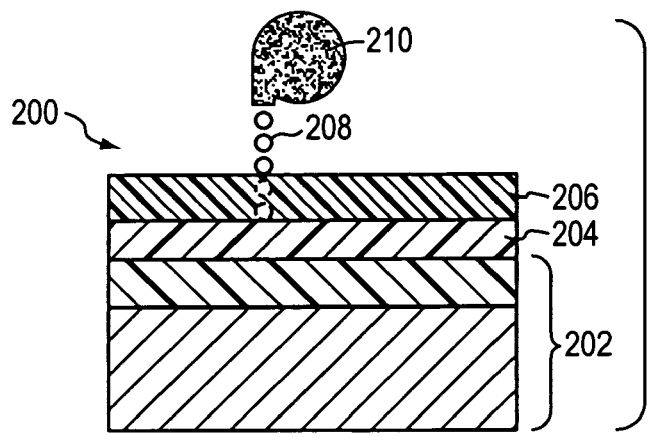
FIGS. 4A-4D are enlarged sectional views of the positive-working printing member of FIG. 2 illustrating an imaging mechanism according to the invention.
Figure 4B:
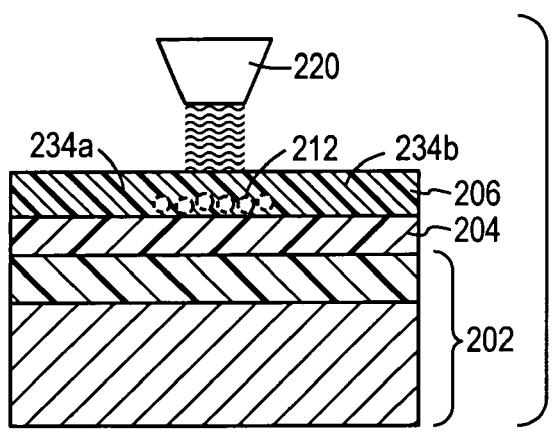
Figure 4C:
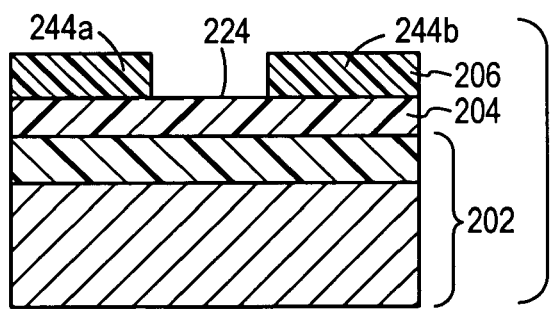
Figure 4D:
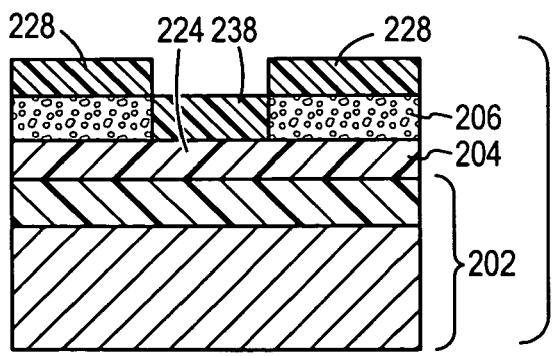

FIGS. 4A-4D illustrate the consequences of imaging the positive-working version of the printing member 200. As illustrated in FIG. 12A, an inkjet printer 210 is used to apply droplets of imaging fluid 208 imagewise onto the photosensitive top layer 206. The imaging fluid 208 wets and penetrates the photosensitive top layer 206, and creates an imaged area 212. The imaged plate 200 is then blanket-exposed to actinic radiation 220, e.g., ultraviolet light, as shown in FIG. 4B. The ultraviolet light induces crosslinking in the non-image areas 244a, 244b, causing these areas to become water-insoluble. The jetted fluid 208 inhibits crosslinking in the imaged area 212, so the imaged area 212 remains water-soluble. FIG. 4C illustrates the imaged plate 200 that has been developed by fountain solution or water. The developer dissolves the imaged area 212, and the underlying oleophilic layer 204 is revealed. As shown in FIG. 4D, the fountain solution 228 adheres to the non-image hydrophilic areas 244a, 244b, while the imaged oleophilic area 224 accepts printing ink 238.

Accordingly, the top layer 206 comprises a material that is hydrophilic or oleophilic, soluble (preferably in water), and photosensitive. Suitable materials for preparing the crosslinkable top layer 206 include water-soluble polymers with photo-crosslinking agents.

A suitable water-soluble photo-crosslinking agent such as bis-azide is particular useful. An example of one such bis-azide is 4,4'-diazidostilbene-2,2'-disodium sulfonate. Other water-soluble bis-azides that can be used include, but are not limited to, 4,4'-diazidobenzalacetone-2,2'-disulfonate disodium salt (described in U.S. Pat. No. 4,191,571, 1,3-bis(4'-azido-2'-sulfobenzylidene)butanone disodium salt, 2,6-bis (4'-azido-2'-sulfobenzylidene)cyclohexanone disodium salt, 2,6-bis(4'-azido-2'sulfobenzylidene)-4-methylcyclohexanone disodium salt, 2,5-bis(4'-azido-2'-sulfobenzylidene)cyclopentanone disodium salt, 4,4'-diazidocinnamylideneacetone-2,2'-disodium sulfonate, 2,6-bis(4'-azido-2'-sulfocinnamylidene)cyclohexanone disodium salt, 2,6-bis (4'-azido-2'-sulfocinnamylidene)-4-methylcyclohexanone disodium salt, and 2,5-bis(4'-azido-2'-sulfocinnamylidene) cyclopentanone disodium salt. In each of the disodium sulfonate compounds, the sodium atoms may be substituted by other atoms or atomic groups such as hydrogen, ammonium, potassium, magnesium, calcium, barium, aluminum, and the like.

The bis-azide is preferably present in the top layer 206 in an amount of from about 2% to about 40% by weight, more preferably from about 4% to about 25% by weight, and most preferably from about 5% to about 10% by weight.

Water-soluble polymers that undergo crosslinking by bis-azides are suitable materials for preparing the top layer 206. Examples include, but are not limited to, polyvinyl pyrrolidone, copolymers of vinyl pyrrolidone, acrylamide-diacetone acrylamide copolymer, polyacrylamide, copolymers of acrylamide, gelatin, and mixtures thereof.

Water-soluble polymers that may or may not be crosslinked by bis-azides in amounts up to about 40% of the weight of the top layer 206 can also be incorporated. Such materials are used to improve coating quality and adhesion. They include polyvinyl alcohol, cellulose, carboxymethylcellulose, hydroxymethylcellulose, hydroxyethylcellulose, hydroxypropylcellulose, polystyrene sulfonic acid, polyacrylic or methacrylic acid, and mixtures thereof. Aromatic diazonium salts may be added at low concentrations to the top layer 206 to improve adhesion. Inorganic pigments such as silica, alumina, clays, and titanium dioxide may be added to improve the hydrophilic properties of the top layer 206.

Another class of compounds that can insolubilize water-soluble polymers by photo-crosslinking are aromatic diazonium salt-containing compounds. They are prepared by the condensation of aromatic diazonium salt compounds and a condensation agent. Formaldehyde is a preferred condensation agent. Other condensation agents that can be used according to the invention include various bis-(alkoxymethyl)diphenyl ethers. Preferred diazonium salt-containing compounds are 4-diazodiphenylamine sulfate, 3-methoxy-4-diazodiphenylamine sulfate, 4-phenoxydiazobenzene zinc chloride double salt, and 2,5-dimethoxy-4-tolylmercaptodiazobenzene zinc chloride double salt. Preferred counter-anions of the aromatic diazonium salts include zinc chloride, sulfate, and mixtures thereof, chloride, dihydrogen phosphate, mixtures of zinc chloride, sulfate and phosphate, and methyl sulfonate. Other counter-ions can also be used.

The diazonium salt-containing compound is preferably present in the top layer 206 in an amount of from about 5% to about 50% by weight, more preferably from about 10% to about 40% by weight, and most preferably from about 15 to about 20% by weight.

The diazonium salt-containing compounds can undergo self-crosslinking to cause insolubilization of the top layer 206 without any participation of the constitutive polymer. A host of water-soluble polymers may therefore be used in the top layer 206 according to the invention. They include, but are not limited to, polyvinyl alcohol, carboxymethylcellulose, hydroxymethylcellulose, hydroxyethylcellulose, hydropropylpropylcellulose, polyacrylic or methacrylic acid, polyvinyl pyrrolidone, copolymers of vinyl pyrrolidone, polyacrylamide, copolymers of polyacrylamide, gelatin, and mixtures thereof.

Suitable oleophilic materials for top layer 206 include acrylate, methacrylate, and vinyl compounds of polyesters, polyurethanes, polyepoxides, bisphenol A resins, and phenoxy resins among others.

Alternatively, the top layer 206 can comprise a mixture of water-soluble monomers and initiators of photo-polymerization. Examples of water-soluble monomers suitable for preparing the top layer 206 according to the invention include, but are not limited to, acrylamide, diacetone acrylamide, N,N'-methylenebisacrylamide, N,N'-ethylene bisacrylamide, diacrylamide, omega acrylamidocaproic acid, piperazine diacrylamide, acrylyl pyrollidone, and mixtures thereof.

Water-soluble photoinitiators that can be used with these water-soluble monomers include, but are not limited to, ceric ammonium oxalate, manganic ammonium oxalate, and photoreducible dyes such as methylene blue, eosin yellow, erythrosin, and rose bengal. These photoreducible dyes require a co-catalyst. A tertiary amine, such as trimethylamine, triethanolamine, and others, can be used. A preferred photo-polymerization initiator is 2-hydroxy-3-(3,4-dimethyl-9-oxo-9H-thioxanthene-2-yloxy)-N,N,N-trimethyl-1-propanaminium chloride together with triethanolamine as a co-catalyst.

As a further alternative, the top layer 206 may be prepared by polyvinyl alcohol containing photo-crosslinking groups. The synthesis and characteristics of highly photosensitive polymers derived from polyvinyl alcohols that contain stilbazolium groups at low mole percent, even less than 1 mole percent, is well known and described, for example, in *J. of Poly. Sci.: Poly. Letters Ed.*, 18:613 (1980). Such materials are commercially available from Toyo Gosei (Ichikawa City, Japan) and Esprix Technologies (Sarasota, Fla.). They are sold as viscous aqueous solutions which upon dilution with water can be coated. They are stable and are effectively crosslinked by light exposure. Their peak light absorption ranges from 342 to 380 nm. Additives such as aromatic diazonium salt-containing compounds can be added to improve adhesion.

The optional use of a thin layer of an aromatic diazonium salt-containing compound between an oleophilic intermediate layer 204 and hydrophilic top layer 206 of the positive plate 200 has been found to significantly improve adhesion. For this purpose, the previously described diazonium salt-containing compounds are preferred. Diazo resins that are solvent-soluble may also be used. Their counter-anions include, but are not limited to, toluene sulfonate, tetrafluoroborate, and hexafluorophosphate. The diazonium salt-containing compounds are coated onto the oleophilic layer 204 from dilute solutions and may have surfactant additives.

A desirable feature of a photosensitive plate that is imaged by inkjet printing is that the plate should be unaffected by exposure to ambient light. The plate can then be imaged without any shielding from room light. This feature can be achieved in the positive plate 200 of this invention by incorporating colorants into the photosensitive top layer 206 that absorb at wavelengths of photosensitivity of the photosensitive top layer 206. The dye concentration should be high enough to enable the coating to be unaffected by exposure to room light and low enough to enable the photoreaction to occur when the top layer 206 is blanket-exposed to more intense radiation. Suitable dyes and pigments for this purpose include, but are not limited to, Acid Yellow 25 (C.I. 18835), Acid Yellow 29 (C.I. 18900), Acridine Yellow G (C.I. 46025), Basic Yellow 2 (C.I. 41000), and aqueous dispersions of carbon black and yellow pigments.

Suitable imaging fluids 208 for imaging the printing member 200 include chemicals that inhibit photoreaction. Antioxidants, for example, can be used to inhibit the photoreaction. Suitable antioxidants for use in imaging fluids 208 according to the invention include, but are not limited to, hydroquinone, 4-methoxyphenol, 2,6-di-(t-butyl)-4-methylphenol, 2,2'-methylenebis-(4-methyl-6-t-butylphenol), diesters of thiodipropionic acid, triarylphosphite, and the nitroso dimer inhibiting system described in British Patent No. 1,453,681.

Alternatively, masking agents can be used as the imaging fluid 208. Examples are dyes or pigments that absorb at wavelengths of photosensitivity of the photosensitive top layer 206. They include, but are not limited to, Acid Yellow 25 (C.I. 18835), Acid Yellow 29 (C.I. 18900), Acridine Yellow G (C.I. 46025), Basic Yellow 2 (C.I. 41000), and aqueous dispersions of carbon black and yellow pigments. Imaging fluids 208 may also be prepared by combining the two types of active agents listed above.

Although imaging methods involving imagewise applying a masking agent on a positive-working printing plate have been disclosed (see, e.g., U.S. Pat. No. 6,245,486), current positive-working plates typically have an oleophilic top layer which becomes soluble when exposed to ultraviolet radiation. A masking agent is applied imagewise on the top layer to prevent solubilization of the imaged area. Similar to negative-working printing plates, currently available positive-working printing plates require removal of the non-image areas to reveal the hydrophilic layer underneath to create an imagewise lithographic pattern.

In contrast, the construction of printing member 200 allows an imaging method that requires only the imaged area to be removed. Since the image of typical imaged lithographic plates represents about 20 to 30% of the plate surface area, only a small portion of the top layer 206 needs to be removed. Accordingly, less coating is accumulated in the developer, and the developer can last longer in the present invention. The printing member 200, therefore, offers benefits that were not previously available.

It will be seen that the foregoing techniques provide a basis for improved lithographic printing and superior plate constructions. The terms and expressions employed herein are used as terms of description and not of limitation, and there is no intention in the use of such terms and expressions of excluding any equivalents of the features shown and described or portions thereof. Instead, it is recognized that various modifications are possible within the scope of the invention claimed.

What is claimed is:

1. A system for lithographic printing comprising:
   (a) a printing member comprising a soluble hydrophilic first layer that itself comprises a photoreactive reagent, and a second oleophilic layer thereunder, and
   (b) an imaging fluid comprising a photoreaction-inhibiting agent comprising a nitroso dimer inhibiting system.

2. A method of imaging a lithographic printing member, the method comprising the steps of:
   (a) providing a printing member comprising a soluble top layer having a first lithographic affinity and comprising a photoreactive reagent and a layer thereunder having a second lithographic affinity opposite to the first lithographic affinity, wherein in response to an imaging fluid, the reactivity of the photoreactive reagent is reduced;
   (b) dispensing the imaging fluid in an imagewise pattern, the imaging fluid chemically reacting with the top layer and inhibiting the reactivity of the photoreactive reagent therein;
   (c) thereafter exposing the printing member to an energy source to initiate a photoreaction in areas where the imaging fluid has not been dispensed, the photoreaction transforming said areas from a water-soluble state to a water-insoluble state;
   (d) removing unreacted portions of the top layer, thereby creating an imagewise lithographic pattern on the printing member.

3. The method of claim 2, wherein the first lithographic affinity is hydrophilicity and the second lithographic affinity is oleophilicity.

4. The method of claim 2, wherein the first lithographic affinity is oleophilicity and the second lithographic affinity is hydrophilicity.

5. The method of claim 2, wherein the photoreaction comprises photo-crosslinking and the photoreactive reagent comprises a photo-crosslinking agent.

6. The method of claim 5, wherein the photo-crosslinking agent comprises a water-soluble bis-azide selected from the group consisting of 4,4'-diazidostilbene-2,2'-disodium sulfonate, 4,4'-diazidobenzalacetone-2,2'-disulfonate disodium salt, 1,3-bis(4'-azido-2'-sulfobenzylidene) butanone disodium salt, 2,6-bis(4'-azido-2'-sulfobenzylidene) cyclohexanone disodium salt, 2,6-bis(4'-azido-2'sulfobenzylidene)-4-methylcyclohexanone disodium salt, 2,5-bis(4'-azido-2'-sulfobenzylidene) cyclopentanone disodium salt, 4,4'-diazidocinnamylideneacetone-2,2'-disodium sulfonate, 2,6-bis(4'-azido-2'-sulfocinnamylidene) cyclohexanone disodium salt, 2,6-bis(4'-azido-2'-sulfocinnamylidene)-4-methylcyclohexanone disodium salt, and 2,5-bis(4'-azido-2'-sulfocinnamylidene) cyclopentanone disodium salt.

7. The method of claim 6, wherein the top layer further comprises a water-soluble polymer selected from the group consisting of polyvinyl pyrrolidone, copolymer of vinyl pyrrolidone, acrylamide-diacetone acrylamide copolymer, polyacrylamide, copolymer of acrylamide, gelatin, and mixtures thereof.

8. The method of claim 5, wherein the photo-crosslinking agent comprises a condensation product of an aromatic diazonium salt and a condensation agent.

9. The method of claim 8, wherein the aromatic diazonium salt is selected from the group consisting of 4-diazodiphenylamine sulfate, 3-methoxy-4-diazodiphenylamine sulfate, 4-phenoxydiazobenzene zinc chloride double salt, and 2,5-dimethoxy-4-tolylmercaptodiazobenzene zinc chloride double salt.

10. The method of claim 8, wherein the condensation agent comprises formaldehyde.

11. The method of claim 8, wherein the condensation agent comprises bis-(alkoxymethyl) diphenyl ether.

12. The method of claim 2, wherein the top layer further comprises a water-soluble polymer selected from the group consisting of polyvinyl alcohol, carboxymethylcellulose, hydroxymethylcellulose, hydroxyethylcellulose, hydropropylpropylcellulose, polyacrylic or methacrylic acid, polyvinyl pyrrolidone, copolymer of vinyl pyrollidone, polyacrylamide, copolymer of polyacrylamide, gelatin, and mixtures thereof.

13. The method of claim 2, wherein the top layer comprises a polyvinyl alcohol comprising a stilbazolium moiety.

14. The method of claim 2, wherein the photoreaction comprises photo-polymerization and the top layer comprises a water-soluble photo-polymerization initiator and a water-soluble polymerizable monomer.

15. The method of claim 14, wherein the water-soluble monomer is selected from the group consisting of acrylamide, diacetone acrylamide, N,N'-methylenebisacrylamide, N,N'-ethylene bisacrylamide, diacrylamide, omego acrylamidocaproic acid, piperazine diacrylamide, acrylyl pyrollidone, and mixtures thereof.

16. The method of claim 14, wherein the water-soluble photo-polymerization initiator is selected from the group consisting of ceric ammonium oxalate and manganic ammonium oxalate.

17. The method of claim 14, wherein the water-soluble photo-polymerization initiator comprises a first component and a second component.

18. The method of claim 17, wherein the first component comprises a photoreducible dye.

19. The method of claim 18, wherein the photoreducible dye is selected from the group consisting of methylene blue, eosin yellow, erythrosin, and rose bengal.

20. The method of claim 17, wherein the second component comprises a catalytic compound.

21. The method of claim 20, where the catalytic compound comprises a tertiary amine.

22. The method of claim 17, wherein the first component comprises 2-hydroxy-3-(3,4-dimethyl-9-oxo-9H-thioxanthene-2-yloxy)-N,N,N-trimethyl-1-propanaminium chloride and the second component comprises triethanolamine.

23. The method of claim 18, wherein the printing member further comprises an adhesive layer disposed between the top layer and the underlying layer.

24. The method of claim 23, wherein the adhesive layer comprises a diazo resin.

25. The method of claim 2, wherein the imaging fluid comprises an antioxidant.

26. The method of claim 25, wherein the antioxidant is selected from the group consisting of hydroquinone, 4-methoxyphenol, 2,6-di-(t-butyl)-4-methylphenol, 2,2'-methylenebis-(4-methyl-6-t-butylphenol), a diester of thiodipropionic acid, and triarylphosphite.

27. The method of claim 2, wherein the imaging fluid comprises a nitroso dimer inhibiting system.

28. The method of claim 2, wherein the imaging fluid comprises a masking agent.

29. The method of claim 28, wherein the masking agent is selected from the group consisting of Acid Yellow 25, Acid Yellow 29, Acridine Yellow G, Basic Yellow 2, and Acid Black 2.

30. The method of claim 28, wherein the masking agent comprises an aqueous dispersion of carbon black and yellow pigment.

* * * * *

UNITED STATES PATENT AND TRADEMARK OFFICE
CERTIFICATE OF CORRECTION

PATENT NO. : 7,608,388 B2  Page 1 of 1
APPLICATION NO. : 11/249166
DATED : October 27, 2009
INVENTOR(S) : Deutsch et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 492 days.

Signed and Sealed this

Twelfth Day of October, 2010

David J. Kappos
*Director of the United States Patent and Trademark Office*